US008577047B2

(12) United States Patent
Gautama

(10) Patent No.: US 8,577,047 B2
(45) Date of Patent: Nov. 5, 2013

(54) CONTROL OF A LOUDSPEAKER OUTPUT

(75) Inventor: Temujin Gautama, Boutersem (BE)

(73) Assignee: NXP B.V., Eindhoven (NL)

( * ) Notice: Subject to any disclaimer, the term of this patent is extended or adjusted under 35 U.S.C. 154(b) by 376 days.

(21) Appl. No.: 13/012,598

(22) Filed: Jan. 24, 2011

(65) Prior Publication Data

US 2011/0182435 A1 Jul. 28, 2011

(30) Foreign Application Priority Data

Jan. 25, 2010 (EP) .................................... 10151542

(51) Int. Cl.
*H03G 11/00* (2006.01)
*H04R 29/00* (2006.01)

(52) U.S. Cl.
USPC ................ 381/55; 381/59; 381/104; 381/106

(58) Field of Classification Search
USPC ........... 381/55, 56, 58, 59, 98, 101, 102, 103, 381/104, 106; 333/14; 455/72
See application file for complete search history.

(56) References Cited

U.S. PATENT DOCUMENTS

| | | | | |
|---|---|---|---|---|
| 5,600,718 | A | 2/1997 | Dent et al. | |
| 6,201,873 | B1 * | 3/2001 | Dal Farra | 381/100 |
| 7,372,966 | B2 * | 5/2008 | Bright | 381/55 |
| 8,019,088 | B2 * | 9/2011 | Holman | 381/55 |
| 8,194,869 | B2 | 6/2012 | Mihelich et al. | |
| 8,340,307 | B2 | 12/2012 | Barr et al. | |
| 2004/0086140 | A1 | 5/2004 | Fedigan et al. | |
| 2005/0031131 | A1 | 2/2005 | Browning et al. | |
| 2007/0136050 | A1 | 6/2007 | Tourwe | |
| 2007/0140058 | A1 | 6/2007 | McIntosh et al. | |
| 2008/0175397 | A1 | 7/2008 | Holman | |
| 2010/0290643 | A1 | 11/2010 | Mihelich et al. | |
| 2010/0310086 | A1 * | 12/2010 | Magrath et al. | 381/71.11 |
| 2012/0179456 | A1 | 7/2012 | Ryu et al. | |

FOREIGN PATENT DOCUMENTS

| | | | |
|---|---|---|---|
| DE | 24 15 816 | A1 | 10/1975 |
| EP | 2 369 852 | A1 | 9/2011 |

OTHER PUBLICATIONS

Harma, A. et al. "Volume Control in Networked Audio Systems", IEEE Int'l. Workshop on Acoustic Signal Enhancement, IWAENC, pp. 245-248 (2005).

Extended European Search Report for European Patent Appln. No. 10151542.7 (Jun. 1, 2010).

* cited by examiner

*Primary Examiner* — Xu Mei
*Assistant Examiner* — William A Jerez Lora

(57) ABSTRACT

A loudspeaker drive circuit comprises a signal path compressor/limiter (12) for implementing a change to the peak-mean amplitude ration in the time domain. A feedforward control loop measures an acoustic quality of the signal at the output of a control loop compressor/limiter (20) or the output of the signal path compressor/limiter (12), and also estimates a loudspeaker excursion based on the signal at the output of the control loop compressor/limiter (20). The signal path compressor/limiter is controlled based on the acoustic quality measurement and excursion estimation.

The invention provides a method for the maximisation of the acoustic output of a loudspeaker by adjusting the characteristics of a compressor/limiter, with the constraint that the audio quality stays acceptable, and that the diaphragm displacement does not exceed a certain threshold.

15 Claims, 1 Drawing Sheet

CONTROL OF A LOUDSPEAKER OUTPUT

CROSS-REFERENCE TO REALTED APPLICATIONS

This application claims priority under 35 U.S.C. §119 of European patent application no. 10151542.7, filed on Jan. 25, 2010,the contents of which are incorporated by reference herein.

This invention relates to the control of the output of a loudspeaker.

An important cause of loudspeaker failures is a mechanical defect that arises when the loudspeaker diaphragm is displaced beyond a certain limit, which is usually supplied by the manufacturer. Going beyond this displacement limit either damages the loudspeaker immediately, or can considerably reduce its expected life-time.

Furthermore, the combination of the use of small loudspeakers and the demand for high acoustic output, indicates the need for loudness maximisation methods, but increases the risk of exceeding the diaphragm displacement limit, also referred to as the 'cone excursion' limit.

There exist several methods to limit the displacement of the diaphragm of a loudspeaker, and they can be divided into three categories.

(i) The first category consists of methods that process the input signal with variable cut-off filters (high-pass or other), the characteristics of which are controlled via a feedback loop. The measured control signal is referred to as the displacement predictor.

(ii) The second category consists of methods that also use a displacement predictor, but which feed it back into the input signal.

(iii) The third category comprises methods that process the signal with a bank of band-pass filters with adjustable gains in such a way that excess excursion is prevented (by attenuating only the frequency bands that cause most excursion).

This third category of methods uses a feedforward strategy. The use of a shelving filter has also been proposed in such a feedforward approach (in U.S. Pat. No. 7,372,966), which is controlled via the displacement predictor in a feedforward manner, using a model of the loudspeaker to pre-process the signal before sending it to the amplifier/loudspeaker.

U.S. Pat. No. 6,201,873 describes a setup for protecting against excess audio distortion (mainly caused by cone excursion), or driving the loudspeaker to its maximum (to maximum cone excursion). It uses a cone excursion transfer function (or a maximal voltage transfer function) module, the output of which is used to control a variable gain on the input. U.S. Pat. No. 6,201,873 suggests the use of a transfer function to give maximal voltage leading to just acceptable distortion, which is the maximal voltage that can be applied per frequency without causing excess distortion. The distortion being considered is that arising from excess cone displacement (no distortion in the converter and amplifier is considered).

This is another example of a feedforward system which uses a filter which has a frequency response matched to the excursion versus frequency relationship of the loudspeaker. This also therefore implements a cone displacement predictor. A compressor is controlled to provide the desired amount of attenuation based on the frequency analysis made by a filter, such that the gain is controlled in a frequency-dependent manner. The control of the gain for a given frequency is a linear function.

This invention relates to a feedforward method of processing, which gives the advantage that no measured signal needs to be fed back, and that the loudspeaker protection is instantaneous, as opposed to having a small delay due to the feedback network.

The aim of this invention is to boost the loudspeaker output signal, while keeping the loudspeaker output similar (but not necessarily identical) to the digital input signal. Thus, the invention is based on the recognition that the loudspeaker protection should take into account audio quality, and not only provide protection for excessive cone excursion.

According to the invention, there is provided a loudspeaker drive circuit comprising:

- a signal path compressor/limiter for implementing a change to the peak-mean amplitude ratio, in the time domain;
- a feedforward control loop, comprising:
  - a control loop compressor/limiter corresponding to the signal path compressor/limiter;
  - a unit for computing a quality measure of the signal at the output of the control loop compressor/limiter;
  - a cone excursion prediction unit for estimating a loudspeaker excursion based on the signal at the output of the control loop compressor/limiter;
  - a controller for controlling the signal path compressor/limiter based on the quality measurement and cone excursion estimation.

The invention provides a method for the maximisation of the acoustic output of a loudspeaker by adjusting the characteristics of a compressor/limiter, with the constraint that the audio quality stays acceptable, and that the diaphragm displacement does not exceed a certain threshold. The compressor/limiter varies the crest factor of the signal (the peak-mean amplitude ratio) and thereby can increase the loudness without increasing the peak amplitude.

The invention uses an adaptive compressor/limiter to maximise the acoustic output of the loudspeaker and limit the diaphragm displacement, rather than linear filtering. The invention is aimed at the maximisation of the acoustic output and the limitation of the diaphragm displacement rather than only limitation of the diaphragm displacement.

The invention uses a compressor and limiter combination (for example having control parameters including gain and clipping level). The transfer function of this compressor/limiter is taken into account in the estimation of the cone displacement, so that this non-linear operation is taken into account in the feedforward control loop. The control loop includes assessment of audio quality, computed on the basis of the distortion caused by digital operations on the digital signal, and not on the basis solely of excursion. The quality measure may take into account expected or measured non-linear effects that are present in the signal path (such as those due to the amplifier or the loudspeaker).

The compressor/limiter has a non-linear transfer function that operates in the time domain (which cannot be implemented using only filtering). The adaptivity of this function limits the amount of distortion and prevents damage to the loudspeaker.

In this way, the acoustic output of the loudspeaker can be maximised while maintaining acceptable audio quality, and at the same time limiting the diaphragm displacement to a safe limit.

The signal path compressor/limiter is preferably adapted to apply a variable gain and implement a controllable dynamic range limiting function. For example, the path compressor/limiter can comprise a variable gain unit and an amplitude clipping unit. Both can be varied, possibly with different response times, based on the quality analysis and on the excursion analysis.

The circuit can further comprise an input filter, for example for implementing one or more of:

removing frequency components corresponding to resonance peaks in the acoustic output of the loudspeaker;

high pass filtering;

boosting lower frequencies;

correcting for the low efficiency with which the low frequencies are reproduced by the loudspeaker.

The input filter can be controlled by the controller to provide adaptive filtering based on the feedforward control loop.

The unit for computing a quality measure can comprise means for comparing the signal before the control loop compressor/limiter with the signal after the control loop compressor/limiter. It can also comprise means for comparing the signal before the signal path compressor/limiter with the signal after the signal path compressor/limiter. It can include a module to model possible non-linear effects that are present in the signal path (such as those due to the amplifier or the loudspeaker).

The invention also provides a portable device comprising a loudspeaker and control circuit of the invention. The portable device can for example comprise a mobile telephone.

The invention also provides a method of processing an audio input signal to derive a loudspeaker drive signal, comprising:

- using a signal path compressor/limiter to implement a change to the peak-mean amplitude ratio, or crest-factor, of the audio input signal in the time domain;
- within a feedforward control loop:
  - using a control loop compressor/limiter corresponding to the signal path compressor/limiter;
  - computing a quality measure of the signal at the output of the control loop compressor/limiter or of the signal path compressor/limiter;
  - estimating a loudspeaker cone excursion based on the signal at the output of the control loop compressor/limiter; and
  - controlling the signal path compressor/limiter based on the quality measurement and excursion estimation.

Examples of the invention will now be described in detail with reference to the accompanying drawings, in which.

The invention provides a loudspeaker drive circuit using a compressor/limiter. A feedforward control loop has a control loop compressor/limiter corresponding to the signal path compressor/limiter. A quality measure of the signal at the output of the control loop or signal path compressor/limiter, possibly followed by a module for modelling non-linear effects in the signal path, such as those due to the amplifier or the loudspeaker, is determined as well as an estimated loudspeaker excursion. The signal path compressor/limiter is controlled based on the acoustic quality measurement and cone excursion estimation.

The system of the invention adjusts the characteristics of a compressor/limiter, and possibly of the filtering operation, on the basis of the audio quality and the diaphragm displacement.

The objective of the system can be considered as obtaining as much sound pressure level (SPL) at the output of the loudspeaker, while maintaining acceptable audio quality, and without damaging the loudspeaker.

Figure 1:
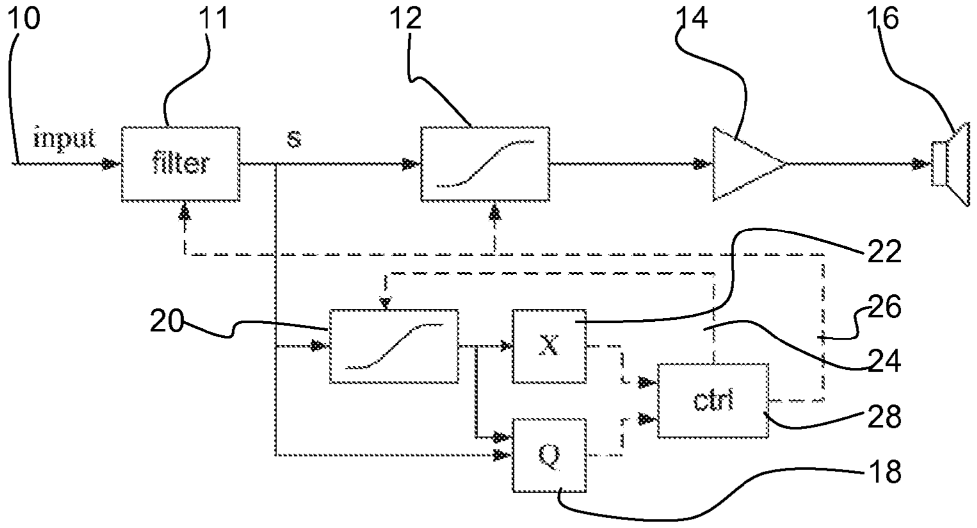
FIG. 1 shows a loudspeaker system of the invention.

The system of the invention is shown in FIG. 1. The (digital) input signal 10 is filtered by filter 11 and sent to a compressor/limiter 12. This signal (after conversion to the analogue domain) is sent to an amplifier 14 to which the loudspeaker 16 is connected. The system has a feedforward control loop, which includes a control loop compressor/limiter 20 corresponding to the signal path compressor/limiter 12. By this is meant that the compressor/limiter 20 implements a non-linear function which can be used to determine the effect of the function of the compressor/limiter 12. They may be identical components, but this is not essential. For example, the effect of the signal path compressor/limiter 12 on the parameters being monitored in the feedforward path (audio quality and cone excursion) may be predictable with a simplified version of the compressor/limiter 12.

The compressor/limiter combines two functions, explained below.

Compression relates to limiting the dynamic range using a variable gain (this can be a slow effect), which can be considered as analogous to an automatic volume control.

Limiting the dynamic range relates to instantaneous (or very fast) limiting of the amplitude, e.g., by hard or soft clipping.

The difference between a compressor and a limiter is somewhat vague, but relates to with how quick and how severe the effect is.

The compressor/limiter thus can comprise a variable gain element (possibly preceded by a linear filter), followed by a fast or instantaneous limiter for limiting of the signal amplitude. The limiter implements a non-linear operation in the time domain (such as clipping).

There are two criteria that are monitored to adapt the characteristics of the compressor/limiter, both of which are computed in a feedforward manner (i.e., they are derived from the input signal):

(i) the audio quality (Q) should be acceptable;

(ii) the loudspeaker diaphragm displacement, or cone excursion (X) should not exceed the maximally allowed level.

The compressor/limiter characteristics (and possibly the filtering operation) may be adjusted on the basis of a slow adaptation to ensure sufficient audio quality and a user-defined average cone excursion, in combination with a fast adaptation to ensure that the maximally allowable diaphragm displacement is not exceeded.

The filtering operation of filter 11 is for removing undesired resonance peaks in the acoustic output of the loudspeaker, although this pre-filtering is not essential. The transfer function of a loudspeaker (from input signal to acoustic output as a function of frequency) can exhibit one or multiple magnitude peaks due to resonance frequencies of the loudspeaker and/or enclosure. Reducing these resonance peaks can 'flatten' the frequency response and create headroom that may be used for boosting the input signal.

The filtering operation may also include a high-pass filter to remove frequencies that are reproduced by the loudspeaker with very low efficiency.

The filtering operation may include a boost or correction of the lower frequencies to compensate for the high-pass characteristic of the acoustic output of the loudspeaker, which is due to the low efficiency with which the low frequencies are reproduced by the loudspeaker. Indeed, in a typical loudspeaker, the acoustic output for frequencies below the loudspeaker resonance frequency are lower than for frequencies above resonance. For a closed-box speaker configuration, e.g., the acoustic output has a low-frequency roll-off that follows a second-order high-pass filter characteristic for frequencies below resonance. This can be corrected down to a user-defined lower frequency limit, at the cost of additional diaphragm displacement.

The operation that is required for the correction (not limited to the closed-box configuration), can be formalised as a filtering operation:

$$s(t) = x(t) * h_{correction}(t) \quad (1)$$
$$= x(t) * (1 + \gamma_{add} \cdot h_{add}(t)), \quad (2)$$

where x(t) is the input signal, * denotes convolution, $h_{correction}(t)$ is the impulse response of the filter required for the correction, $\gamma_{add}$ is a gain controlling the amount of correction. $h_{add}(t)$ is the impulse response of the filter that yields the 'correction' signal, i.e., the signal that is added to the original signal, x(t), to obtain the corrected signal, s(t). The correction operation can be controlled by means of $h_{add}(t)$ and $\gamma_{add}$, the characteristics of the correction, e.g., down to which frequency the correction is performed, and its gain.

The filtering operation may implement a combination of any of the functions outlined above.

The term compressor/limiter is used to refer to any module that changes the crest factor of a signal, i.e., the peak-to-mean amplitude ratio. An example is an amplification followed by a saturating nonlinearity (e.g., a sigmoid function or a hard limiter). This can result in an increase of signal power without increasing the maximal signal amplitude, which in turn, can result in an increased sound pressure level at the output of the loudspeaker.

The characteristics of the compressor/limiter are adaptive.

The audio quality of the compressed signal, at the output of the control loop compressor/limiter 20 or of the signal path compressor/limiter 12 in FIG. 1, can be estimated by comparing it to the uncompressed signal. Thus, as shown in FIG. 1, the uncompressed audio signal s is providing to the quality monitoring block 18. In FIG. 1, the quality monitoring block is has as input the output of the control loop compressor/limiter, but the output of the signal path compressor limiter can instead be used. Both arrangements are still feedforward approaches in that the compressed signal is used for controlling the adaptation of the output and not for computing the output at that time.

The quality measures can be based on psycho-acoustic models, or simple distortion-based models. It can include a module to model possible non-linear effects that are present in the signal path (such as those due to the amplifier or the loudspeaker). The various possibilities will be known to those skilled in the art.

An example of a quality measure is the mean-square-error between the original signal, scaled with the gain expected from the compressor/limiter, and the compressed signal.

An audio quality threshold should be defined, depending on the loudspeaker. Indeed, lower-quality loudspeakers may allow for a higher degree of distortion before the audio quality becomes unacceptable.

The diaphragm displacement, also called cone excursion, can be determined from a model of the loudspeaker, the parameters of which can be estimated in an on-line or off-line manner, or the parameters can be known from design.

The excursion is predicted for the signal after the compressor/limiter using characteristics supplied by the control module.

For this purpose, the feedforward path includes the compressor/limiter 20 corresponding to the signal path compressor/limiter, in front of the cone excursion predictor unit 22. In this way, the influence of the compressor/limiter is taken into account in the cone excursion prediction. Thus, the cone excursion is predicted for the current (compressed) input signal, such that the control can be performed in a feedforward manner and without delay. The computation of the excursion can be an iterative process (as a result of the non-linearity) and the control loop compressor limiter is used for this iterative process so that the signal path is not disturbed by this process.

The control mechanism can combine a slow adaptation and a fast adaptation.

The slow adaptation can increase the level of compression if the audio quality is above a certain threshold, and decrease otherwise. The fast adaptation can quickly alter the compression function if the expected cone excursion exceeds the maximally allowed limit. Determining the desired compression characteristics to limit the desired cone excursion can consist of an iterative procedure, since a compressor/limiter implements a non-linear operation. This iterative procedure is represented by the dashed line 24 from the control module 28 to the compressor/limiter 20 preceding the excursion predictor 22.

The control mechanism can optionally control the filtering operation as also shown in FIG. 1 (dashed line 26). This may be to allow for a larger bandwidth by changing the cut-off frequency of the high-pass filter. In that case, a trade-off between increased bandwidth and increased level of compression is chosen.

The control mechanism can optionally control the low-frequency correction in such a way that the bandwidth is extended or decreased by modifying $h_{add}(t)$.

The control mechanism can optionally control the gain of the (fixed) low-frequency correction, $\gamma_{add}$. In that case, it is possible to limit the low-frequency correction in a first step, and, if this is insufficient, the level of compression.

The system further comprises a digital to analogue converter, which is not shown in FIG. 1, as part of the loudspeaker drive system. The main processing can be implemented on a DSP or micro-controller.

The source signal at the input 10 can be retrieved from a memory, or can be input to the DSP or microcontroller via an analogue-to-digital converter (ADC).

The invention can be used for maximising the loudness in sound reproduction systems, while protecting the loudspeakers. An important application is in mobile phones, where lower-quality loudspeakers are often employed, but high acoustic output is desired.

Figure 2:
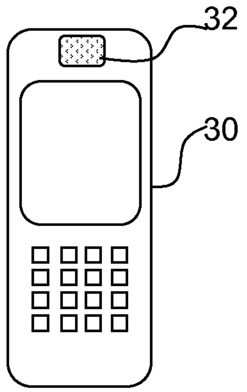
FIG. 2 shows a mobile telephone in which the loudspeaker system can be implemented.

FIG. 2 shows a mobile phone 30 including the loudspeaker system 32 of the invention.

Various modifications will be apparent to those skilled in the art.

The invention claimed is:

1. A loudspeaker drive circuit comprising:
- a signal path compressor/limiter configured to change a peak-mean amplitude ratio in a time domain;
- a feedforward control loop, comprising:
  - a control loop compressor/limiter corresponding to the signal path compressor/limiter;
  - a unit for computing a quality measure of the signal at an output of one of the control loop compressor/limiter and the signal path compressor/limiter based on an input signal of the feedforward control loop;
  - an excursion prediction unit for estimating a loudspeaker excursion based on the signal at the output of the control loop compressor/limiter; and
  - a controller for controlling the signal path compressor/limiter based on the quality measurement and excursion estimation.

2. A circuit as claimed in claim 1, wherein the signal path compressor/limiter is adapted to apply a variable gain and implement a controllable dynamic range limiting function.

3. A circuit as claimed in claim 1, wherein the signal path compressor/limiter comprises a variable gain unit and an amplitude clipping unit.

4. A circuit as claimed in claim 1, further comprising an input filter.

5. A circuit as claimed in claim 4 wherein the input filter implements at least one of:

removing frequency components corresponding to at least one resonance peak in the acoustic output of the loudspeaker;

high pass filtering; boosting lower frequencies; and correcting the expected low efficiency with which low frequencies are reproduced by the loudspeaker.

6. A circuit as claimed in claim 4, wherein the input filter is controlled by the controller.

7. A circuit as claimed in claim 1, wherein the unit for computing a quality measure comprises means for comparing the signal before the control loop or signal path compressor/limiter with the signal after the control loop or signal path compressor/limiter.

8. A circuit as claimed in claim 1, wherein the unit for computing comprises a module to model the non-linear effects that are present in the signal path.

9. A loudspeaker system comprising a circuit as claimed claim 1 and a loudspeaker.

10. A portable device comprising a loudspeaker system as claimed in claim 9.

11. The portable device of claim 10, wherein the portable device is a mobile telephone.

12. A method of processing an audio input signal to derive a loudspeaker drive signal, comprising:

using a signal path compressor/limiter to change a peak-mean amplitude ratio of an audio input signal in a time domain;

within a feedforward control loop:

using a control loop compressor/limiter corresponding to the signal path compressor/limiter;

computing a quality measure of the signal at an output of one of the control loop compressor/limiter and the signal path compressor/limiter based on an input signal of the feedforward control loop;

estimating a loudspeaker excursion based on the signal at the output of the control loop compressor/limiter; and controlling the signal path compressor/limiter based on the quality measurement and excursion estimation.

13. A method as claimed in claim 12, wherein using the signal path compressor/limiter comprises applying a variable gain and implementing a controllable dynamic range limiting function.

14. A method as claimed in claim 12, further comprising filtering the audio input signal before application to the signal path compressor/limiter to:

remove frequency components corresponding to at least one resonance peak in the acoustic output of the loudspeaker, and/or perform high pass filtering, and/or boost lower frequencies, and/or correct the expected low efficiency with which low frequencies are reproduced by the loudspeaker.

15. A method as claimed in claim 14, wherein the filtering is controlled by the feedforward control loop.

* * * * *